United States Patent
Yamaguchi

(10) Patent No.: US 9,178,294 B2
(45) Date of Patent: Nov. 3, 2015

(54) PRINTED CIRCUIT BOARD AND ELECTRONIC DEVICE USING PRINTED CIRCUIT BOARD

(71) Applicant: Hitachi Automotive Systems, Ltd., Hitachinaka-shi (JP)

(72) Inventor: Takuto Yamaguchi, Toride (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 76 days.

(21) Appl. No.: 13/655,049

(22) Filed: Oct. 18, 2012

(65) Prior Publication Data

US 2013/0100628 A1  Apr. 25, 2013

(30) Foreign Application Priority Data

Oct. 20, 2011  (JP) ................. 2011-230605

(51) Int. Cl.
| | |
|---|---|
| H05K 1/11 | (2006.01) |
| H01R 12/58 | (2011.01) |
| H05K 3/30 | (2006.01) |
| H05K 1/02 | (2006.01) |

(52) U.S. Cl.
CPC .............. H01R 12/585 (2013.01); H05K 1/116 (2013.01); H05K 3/308 (2013.01); *H05K 1/0271* (2013.01); *H05K 2201/1059* (2013.01); *H05K 2201/10189* (2013.01)

(58) Field of Classification Search
CPC ........ H01R 12/55; H01R 12/57; H01R 12/58; H01R 12/585; H05K 3/308; H05K 1/115; H05K 1/116; H05K 2201/1059; H05K 1/0271
USPC .......... 361/772, 792, 760, 748; 174/266, 250, 174/257, 261, 262, 263, 264, 265, 267; 439/81, 82
See application file for complete search history.

(56) References Cited

U.S. PATENT DOCUMENTS

| | | | |
|---|---|---|---|
| 5,191,174 A * | 3/1993 | Chang et al. .................. 174/266 |
| 7,326,856 B2 * | 2/2008 | Takada .......................... 174/250 |
| 8,227,709 B2 * | 7/2012 | Tsubamoto ................... 174/262 |
| 2008/0087460 A1 * | 4/2008 | Fung ............................. 174/262 |

FOREIGN PATENT DOCUMENTS

| | | |
|---|---|---|
| JP | 2004-134302 A | 4/2004 |
| JP | 2008-244349 A | 10/2008 |
| JP | 2008-294299 A | 12/2008 |
| JP | 2009-289447 A | 12/2009 |

* cited by examiner

*Primary Examiner* — Angel R Estrada
*Assistant Examiner* — Dimary Lopez Cruz
(74) *Attorney, Agent, or Firm* — Crowell & Moring LLP

(57) ABSTRACT

An electronic device having a press-fit connection for connecting a connector and an electronic part mounted on a printed circuit board which is possible to enable high density mounting. Viewing the printed circuit board from an upper surface, between adjacent through holes on which a compressive force acts upon insertion of the press-fit terminal, among the large number of through holes, a land or a conductor film connected to the conductor film formed on the inner wall surface of the through hole or the conductor film not connected to the conductor film formed on the inner wall surface of the through hole, formed in the circuit board held between the top layer circuit board and the bottom layer circuit board, exists in a width equal to or wider than the diameter of the through hole.

8 Claims, 6 Drawing Sheets

|  | h (mm) | SURFACE EXPANSION | DAMAGE TO RESIST |
|---|---|---|---|
| EMBODIMENT | 2.0 | ○ | ○ |
|  | 1.5 | ○ | ○ |
|  | 1.0 | ○ | ○ |
| COMPARATIVE EXAMPLE | 0.5 | × | × |

|  | h (mm) | D1 (mm) | SURFACE EXPANSION | DAMAGE TO RESIST | LIFE |
|---|---|---|---|---|---|
| EMBODIMENT | 2.0 | 0.9 | ○ | ○ | ○ |
|  |  | 2.5 | ○ | ○ | ○ |
|  | 1.5 | 0.9 | ○ | ○ | ○ |
|  |  | 2.5 | ○ | ○ | ○ |
|  | 1.0 | 0.9 | ○ | ○ | ○ |
|  |  | 2.5 | ○ | ○ | ○ |
| COMPARATIVE EXAMPLE | 0.5 | 0.9 | × | × | × |
|  |  | 2.5 | × | × | × |

# PRINTED CIRCUIT BOARD AND ELECTRONIC DEVICE USING PRINTED CIRCUIT BOARD

CLAIM OF PRIORITY

The present application claims priority from Japanese Patent Application JP 2011-230605 filed on Oct. 20, 2011, the content of which is hereby incorporated by reference into this application.

BACKGROUND

The present invention relates to a wiring board (printed circuit board) for press-connection of circuit boards, modules and connectors, and an electronic device having the circuit board.

In recent years, as a connection method upon mounting parts and the like on a circuit board where electric wires are formed, press-fit connection attracts attention. Conventionally, the press-fit connection is used in a main frame computer or the like as solderless connection method to remove difficulty in soldering between circuit board. However, in recent years, the press-fit connection is more frequently applied to an on-vehicle electronic device such as ABS (Antilocked Braking System) since (1) the connection process is simple, (2) the equipment investment to establish the process is small, and (3) it is possible to realize higher density mounting in comparison with soldering.

Japanese Patent Application Laid-Open Publication No. 2004-134302 discloses dispersing stress on a circuit board between through holes by changing a press-insertion direction of a press-fit terminal so as to improve the reliability of the circuit board. According to this method, when a part is arranged between the through holes, it is possible to reduce the stress applied on the part.

Japanese Patent Application Laid-Open Publication No. 2008-294299 discloses inserting a press-fit terminal in a printed circuit board having a metal core so as to improve the reliability. According to this method, as the hard metal core receives the distortion of the terminal, it is possible to reduce the distortion of the printed circuit board.

In the method disclosed in Japanese Patent Application Laid-Open Publication No. 2004-134302, high stress is applied in a direction where the distortion is initially small. Accordingly, regarding the direction in which the spring force acts, it is necessary to arrange the part away. This cases wasteful space. Further, high density mounting is limited.

In the method disclosed in Japanese Patent Application laid-Open Publication No. 2008-294299, the metal core board is not widely used since the cost of the metal core board is generally high.

SUMMARY

The present invention has an object to provide an electronic device to, realize high density mounting at a low cost.

To address the above object, present invention provides a printed circuit board in which three or more layers of circuit boards are laminated and a large number of through holes for insertion of terminal pins of an electronic part are formed, wherein lands of a conductor material are formed around a first through hole and a second through hole of the large number of through holes on surfaces of a top layer circuit board and a bottom circuit board, and the first land around the first through hole and the second land around the second through hole formed on the side of the top layer circuit board are electrically connected to the land around the first through hole and the land around the second through hole formed on the side of the bottom layer circuit board via a conductor member formed on an inner wall surface of the first through hole and a conductor member formed on an inner wall surface of the second through hole, and wherein, in a circuit board held between the top layer circuit board and the bottom layer circuit board, a first conductor film connected to the conductor member formed on the inner wall surface of the first through hole and a second conductor film connected to the conductor member formed on the inner wall surface of the second through hole, and a third conductor film, held between the first conductor film and the second conductor film, not electrically connected to the first conductor film and the second conductor film, are formed, further wherein, when the printed circuit board is viewed from an upper surface, in a region from the first through hole to the second through hole, any one of the first land and the second land, the first conductor film and the second conductor film, and the third conductor film, exists in a width equal to or wider than a diameter of the first through hole and the second through hole.

Further, to address the above object, present invention provides a printed circuit board in which three or more layers of circuit boards are laminated and a large number of through holes for insertion of press-fit terminals of an electronic part are formed, wherein lands of a conductor material are formed around the through holes on a front surface and a rear surface of the printed circuit board, and the lands on the side of the front surface and the lands on the side of the rear surface are electrically connected via conductor films formed on inner wall surfaces of the through holes, and wherein a plurality of conductor films, including a conductor film connected to the conductor film formed on the inner wall surface of the through hole and a conductor film not electrically connected to the conductor film formed on the inner wall surface of the through hole, are formed on a circuit board held between a top layer circuit board and a bottom layer circuit board among the three or more layers of laminated circuit boards, further wherein when the printed circuit board is viewed from an upper surface, between adjacent through holes on which a compressive force acts upon insertion of the press-fit terminal, among the large number of through holes, the land or the conductor film connected to the conductor film formed on the inner wall surface of the through hole or the conductor film not electrically connected to the conductor film formed on the inner wall surface of the through hole, formed in the circuit board held between the top layer circuit board and the bottom layer circuit board, exists in a width equal to or wider than the diameter of the through hole.

Further, to address the above object, the present invention provides an electronic device using a printed circuit board including: a base plate; a first radiation member attached to the base plate; a first printed circuit board attached to the base plate via the first radiation member, where an electronic part is mounted on a surface; a cover fixed to the base plate, covering the radiation member and the first printed circuit board; a second printed circuit board attached to a surface of the cover opposite to the first printed circuit board via a second radiation member, where an electronic part is mounted on a surface; and a connector that electrically connects the first printed circuit board to the outside, wherein the first printed circuit board is connected to the second printed circuit board and the connector using a press-fit terminal, and wherein in the first printed circuit board, where three or more layers of circuit boards are laminated, and a large number of through holes for insertion of the press-fit terminal are formed, further wherein lands of a conductor material are formed around a first through hole and a second through hole among the large number of through holes on the respective surfaces of the top layer circuit board and the bottom layer circuit board, and a first land around the first through hole and a second land around the second through hole formed on the side of the top layer circuit board are electrically connected to the land around the first through hole and around the second through hole formed on the side of the bottom layer circuit board, via a conductor member formed on an inner wall surface of the first through hole or a conductor member formed on an inner wall surface of the second through hole, and wherein on the circuit board held between the top layer circuit board and the bottom layer circuit board, a first conductor film connected to the conductor member formed on the inner wall surface of the first through hole, a second conductor film connected to the conductor member formed on the inner wall surface of the second through hole, and a third conductor film held between the first conductor film and the second conductor film, and not electrically connected to the first conductor film and the second conductor film, are formed, further wherein, when the first printed circuit board is viewed from an upper surface, in a region from the first through hole to the second through hole, one of the first land, the second land, the first conductor film, the second conductor film and the third conductor film, exists in a width equal to or wider than the diameter of the first through hole and the second through hole or a wider region.

Further, to address the above object, present invention provides an electronic device using a printed circuit board including: a base plate; a first radiation member attached to the base plate; a first printed circuit board attached to the base plate via the first radiation member, where an electronic part is mounted on a surface; a cover fixed to the base plate, covering the radiation member and the first printed circuit board; a second printed circuit board attached to a surface of the cover opposite to the first printed circuit board via a second radiation member, where an electronic part is mounted on a surface; and a connector that electrically connects the first printed circuit board to the outside, wherein the first printed circuit board is connected to the second printed circuit board and the connector via a press-fit terminal, and wherein in the first printed circuit board, three or more layers of circuit boards are laminated and a large number of through holes for insertion of the press-fit terminal are formed, further wherein lands of a conductor material are formed around the through holes on front surface and rear surface of the first printed circuit board, and the land on the side of the front surface and the land on the side of the rear surface are electrically connected with each other via a conductor film formed on the inner wall surface of the through hole, further wherein a plurality of conductor films, including a conductor film connected to the conductor film formed on the inner wall surface of the through hole and a conductor film not electrically connected to the conductor film formed on the inner wall surface of the through hole, are formed in the circuit board held between the top layer circuit board and the bottom layer circuit board among the three or more laminated layers of circuit boards, further wherein, when the printed circuit board is viewed from the upper surface, between adjacent through hole, on which a compressive force acts upon insertion of the press-fit terminal, among the large number of through holes, the land or the conductor film connected to the conductor film formed on the inner wall surface of the through hole or the conductor film not electrically connected to the conductor film formed on the inner wall surface of the through hole, formed in the circuit board held between the top layer circuit board and the bottom layer circuit board, exists in a width equal to or wider than the diameter of the through hole.

According to the aspects of the present invention, it is possible to reduce expansion of the surface of a printed circuit board and realize higher density mounting. Thus downsizing of an electronic device is realized.

These features and advantages of the invention will be apparent from the following more particular description of preferred embodiments of the invention, as illustrated in the accompanying drawings.

BRIEF DESCRIPTION OF THE DRAWINGS

The above and other object, features and advantages of the present invention will become more apparent from the following detailed description when taken in conjunction with the accompanying drawings wherein.

DESCRIPTION OF THE PREFERRED EMBODIMENTS

Preferred embodiments of the present invention will now be described in detail in accordance with the accompanying drawings.

Figure 1:
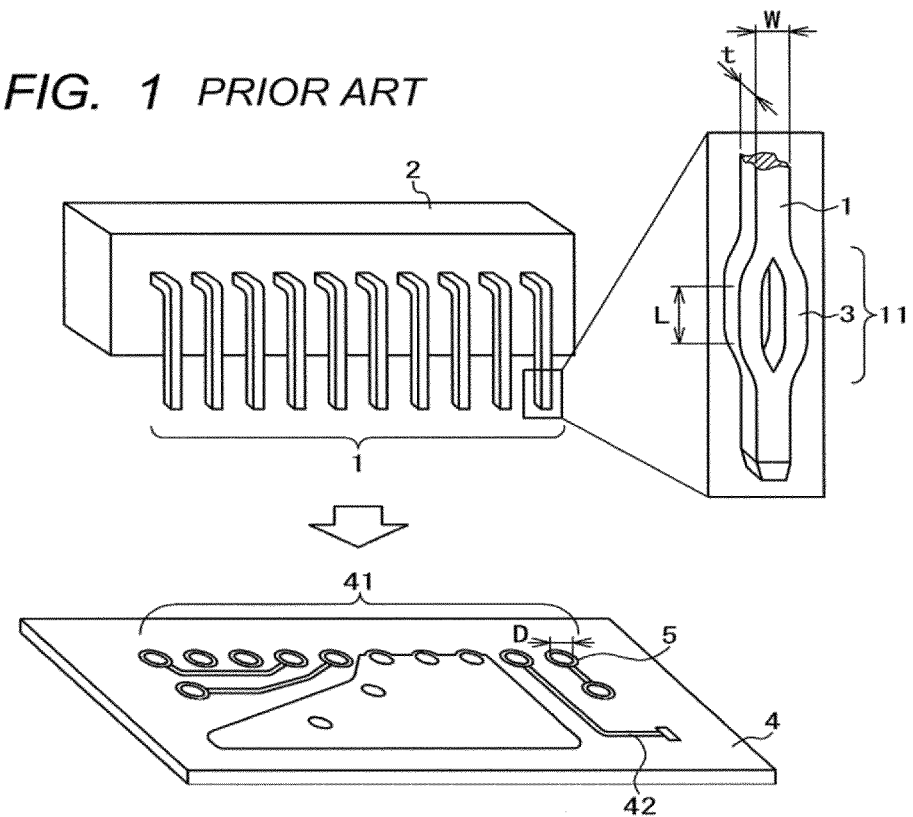
FIG. 1 is a perspective diagram showing connection of press-fit terminals with a printed circuit board.

FIG. 1 shows an example of press-fit connection. As shown in FIG. 1, the press-fit connection is a method of press-inserting plural press-fit terminals 1, provided on a press-fit connector 2, in plural through holes 5 provided in a circuit board (printed circuit board) 4, and performing mechanical and metallic connection between the press-fit terminals 1 and wires in the through holes 5, so as to establish electric connection.

As shown in a right-side enlarged view in FIG. 1, a connection member 11 of the press-fit terminal 1 has a spring structure having a width w greater than an inner diameter D of the through hole 5, a flat part in a length L, and a thickness t. Accordingly, when the press-fit terminal 1 has been press-inserted in the through hole 5, the press-fit terminal 1 is held in the through hole 5 by action of a spring force of the connection member 11 of the press-fit terminal 1. In this connection method, different from conventional solder connection, it is possible to realize connection without heating, at normal-temperatures, and in short time.

On the other hand, regarding a vehicle electronic device, since there is limitation of mounting space, it is necessary to downsize the device as much as possible. When terminal connection members of the electronic device are soldered, it is necessary to ensure at least a predetermined interval between the terminal and a part so as to avoid attachment of solder jet to the part already mounted on the circuit board. This interval is wasteful space which disturbs device downsizing. On the other hand, in the press-fit connection, since solder is not sprayed, such wasteful interval can be narrowed. Accordingly, the press-fit connection is preferable to device downsizing.

Further, in consideration of further downsizing and higher-density mounting, the distortion applied by the spring force of the connection member 11 of the press-fit terminal 1 may regulate the limit of high density mounting. Much stress is applied to the vicinity of the through hole 5 of the printed circuit board 4 in which the press-fit terminal 1 is inserted, and there is a probability of damage to the printed circuit board 4.

Figure 2:
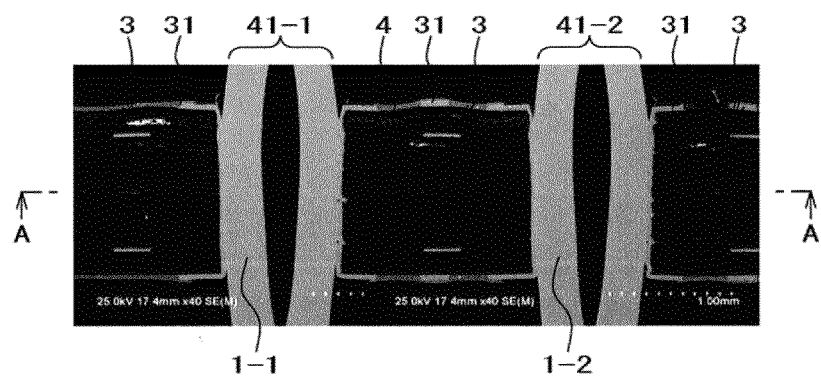
FIG. 2 is a cross-sectional diagram of a sample of connection of the press-fit terminals with the printed circuit board, viewed from a lateral direction of the sample, showing expansion positions.
Figure 3:
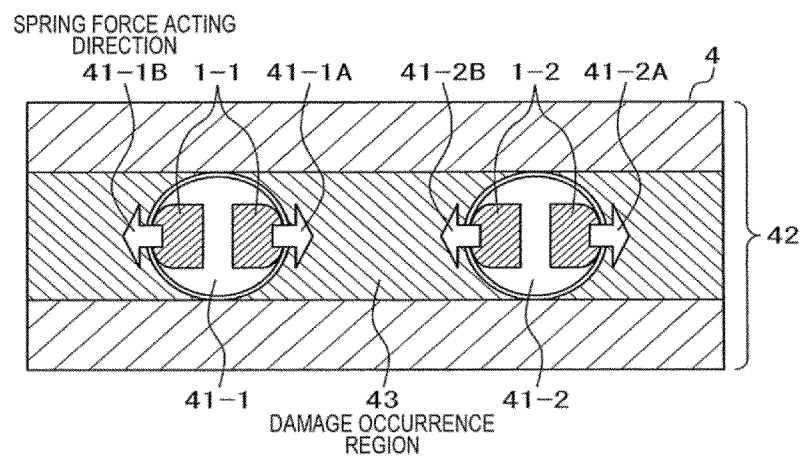
FIG. 3 is a cross-sectional diagram of the sample of connection of the press-fit terminals with the printed circuit board, viewed from an upper direction of the sample, showing the expansion positions.

For example, FIG. 2 is a cross-sectional diagram of the printed circuit board 4 viewed from a lateral direction in a status where the press-fit terminals 1-1 and 1-2 are inserted in the adjacent through holes 41-1 and 41-2. Further, FIG. 3 schematically shows a status of forces generated with the press-fit terminals 1-1 and 1-2 when a cross-section A-A' in FIG. 2 is viewed from an arrow direction. As the spring forces act in the directions of the arrows 41-1A and 41-2B shown in FIG. 3, i.e., mutually pressing directions between the adjacent through holes 41-1 and 41-2, damage 3 (distortion due to the collapse of material 42 (glass fiber or insulating resin)) occurs in a region 43 of the material 42 forming the printed circuit board 4.

In correspondence with degree of the damage (the degree of distortion due to the collapse of the material 42 in the surface shown in FIG. 3) occurred in the damage occurrence region 43, expansion 31 occurs in the surface of the printed circuit board 4. When the expansion 31 occurs, problems such as followings occur. (a) breakage of wire in the vicinity of the expansion 31 of the printed circuit board 4, (b) degradation of humidity resistance due to peeling of solder resist formed around the through hole of the printed circuit board 4, (c) change of electric characteristic due to distortion of parts such as chip resistors mounted on the printed circuit board 4, and (d) deterioration of joint reliability in the solder connection member of the parts such as chip resistors mounted on the printed circuit board 4.

To prevent occurrence of such damage to the printed circuit board 4, it is considered that the distance between the through holes may be increased so as not to cause occurrence of the expansion 31, or the electronic part to be mounted may be arranged away from the position where the expansion 31 occurred. However, with these arrangements, the area of the printed circuit board is increased, and the electronic device cannot be downsized without difficulty. Accordingly, to achieve downsizing of electronic device, the present invention provides a printed circuit board in which damage and distortion of the circuit board and due to a spring force can be mitigated and an electronic device using the printed circuited board.

The present invention addresses the above objects.

(1) In a printed circuit board in which a press-fit terminal is inserted and an electronic device using the printed circuit board, an inner layer and a surface wiring wider than a diameter of the through hole are arranged in a direction in which a spring force of the terminal acts in the through hole in which the terminal is inserted.

(2) The printed circuit board and the electronic device using the printed circuit board has an annular ring conducting to the through hole in the inner layer of the printed circuit board, and a land having an area wider than that of the annular ring on the surface layer. Further, a deformation constraint wiring, insulated from the annular ring, is arranged in the inner layer up to a position closer to the through hole than the outer periphery of the land formed on the surface layer.

Hereinbelow, embodiments of the present invention will be described with reference to the drawings. Note that in all the figures for explaining the embodiments, the same member has the same reference numeral in principle, and the repeated explanation will be omitted.

As an example to implement the present invention, FIGS. 4A to 4C and FIGS. 5A to 5C show cross-sections of a printed circuit board in which press-fit terminals are inserted in through holes. In the present invention, a multilayer printed circuit board having n layers is used; however, for the purpose of simplification of explanation, the printed circuit board here has four layers. In the cross-section of a printed circuit board 400 or 500 shown in FIGS. 4A and 5A, the top layer circuit board is a first layer 401; the next top layer circuit board, a second layer 402; the further next layer circuit board, a third layer 403; and the bottom layer circuit board, a fourth layer 404. The press-fit terminal 100 is inserted into through holes 411-1 to 411-3 from the side of the first layer 401. The diameter of the through holes 411-1 to 411-3 provided in the printed circuit board 400 or 500 is Ø.

Figure 4A:
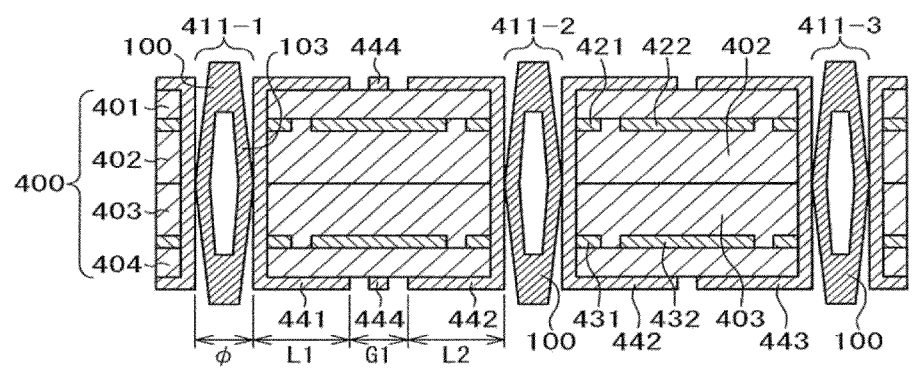
FIG. 4A is a cross-sectional diagram showing a wiring structure of a printed circuit board having rectangular lands, according to a first embodiment of the present invention.
Figure 4B:
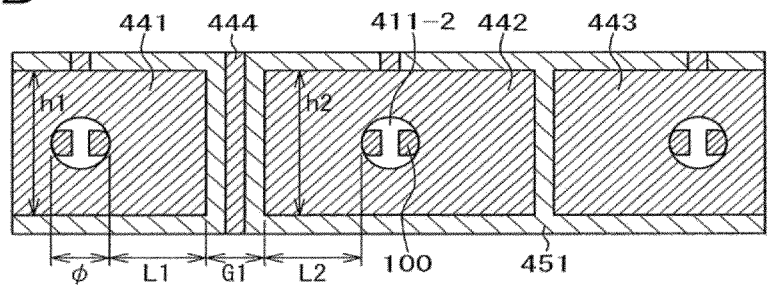
FIG. 4B is a plane diagram showing the wiring structure of the printed circuit board having the rectangular lands, according to the first embodiment of the present invention.
Figure 4C:
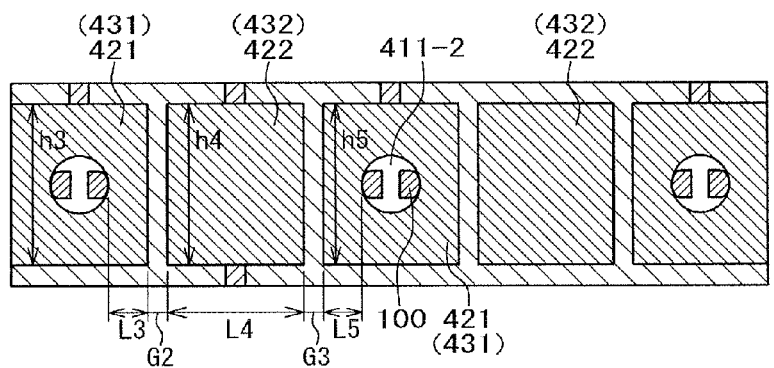
FIG. 4C is a plane diagram of a second layer circuit board showing the wiring structure of the printed circuit board having the rectangular lands, according to the first embodiment of the present invention.
Figure 5A:
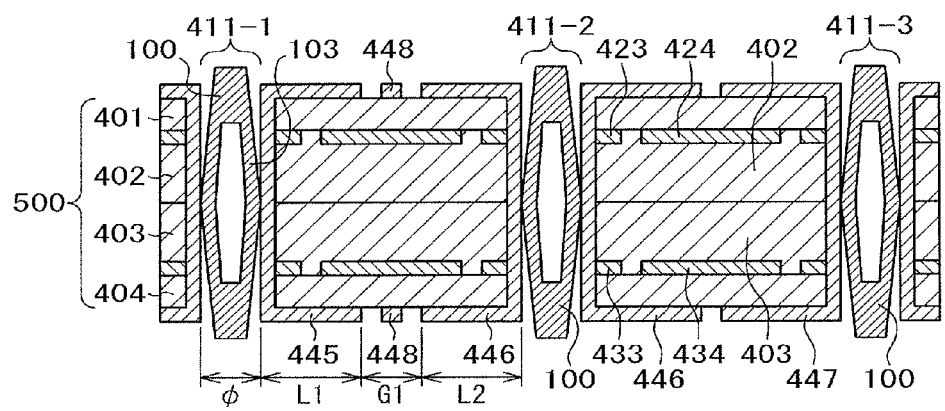
FIG. 5A is a cross-sectional diagram showing the wiring structure of the printed circuit board having circular lands, according to a second embodiment of the present invention.
Figure 5B:
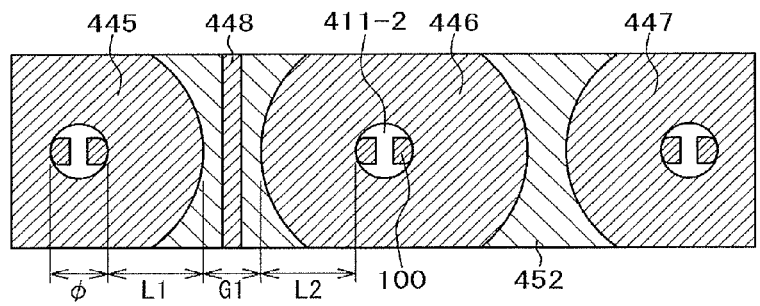
FIG. 5B is a plane diagram showing the wiring structure of the printed circuit board having the circular lands, according to the second embodiment of the present invention.
Figure 5C:
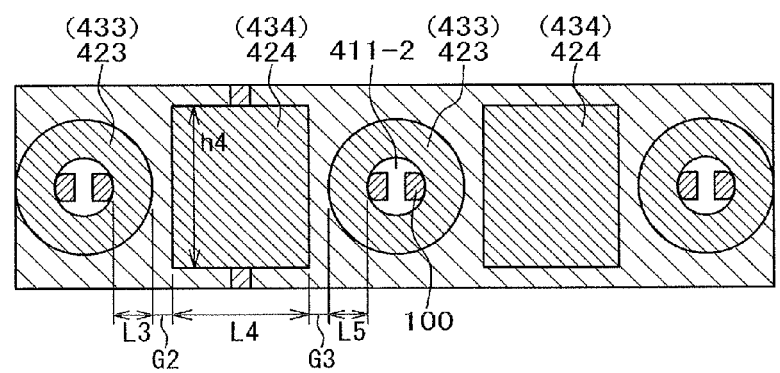
FIG. 5C is a plane diagram of the second layer circuit board showing the wiring structure of the printed circuit board having the circular lands, according to the second embodiment of the present invention.

First, as shown in FIG. 4C or 5C, wirings 421, 431, 422 and 432 (in the case of FIG. 5C, wirings 423, 433, 424 and 434) are formed on the second layer circuit board 402 and the third layer circuit board 403 where circuit patterns (not shown) are formed on the surfaces. The wirings 421 and 431 (in FIG. 5C, the wirings 423 and 433) are called annular rings and have a role to enhance the strength so as to prevent drop of the wirings from the wall surfaces of the through holes 411-1 and 411-3 upon insertion of the press-fit terminal 100.

The widths of the wirings 421 and 431 (in FIG. 5C, the wirings 423 and 433) are set as L3 and L4 from ends of the through holes 411-1 to 411-3 having the diameter Ø. Further, the lengths in a direction orthogonal to the widths L3 and L4 are h3 and h5. As indicated as the wirings 421 and 431 in FIG. 4C, the shape of the wirings 421 and 431 may be a rectangular shape, or may be a circular shape as indicated as the wiring 423 (433) in FIG. 5C. Further, the wirings 422 and 432 (in FIG. 5A, the wirings 424 and 434) are formed away by G2 or G3 from the wirings 421 and 431 (in FIG. 5A, the wirings 423 and 433), and have a width L5 and a depth h3. The wiring 422 (432) will be referred to as deformation constraint wiring.

Next, the second layer circuit board 402 where a circuit pattern (not shown) is formed on the surface and the wirings 421 and 422 (in FIG. 5C, the wirings 423 and 424) are formed, and the third layer circuit board 403 where the wirings 431 and 432 (in FIG. 5C, the wirings 433 and 434) are formed, are joined by laminating the first layer 401 and the fourth layer 404 where circuit patterns (not shown) are formed on the surfaces. Then the through holes 411-1 to 411-3 are formed by drill-processing the laminated first layer 401 to the fourth layer 404 circuit boards.

Next, wirings 441 to 443 (FIG. 4A) or 445 to 447 (FIG. 5A), to be connected to the surface layers (the first layer and the fourth layer) on the both sides of the printed circuit board 400 or 500 through inside the respective through holes 411-1 to 411-3, are formed in the through holes 411-1 to 411-3. The wirings 441 to 443 (FIG. 4A) or 445 to 447 (FIG. 5A) are connected to the wirings 421 and 431 (423 and 433 in FIG. 5A) formed on the second layer circuit board 402 and the third layer circuit board 403. The wirings 441 to 443 or 445 to 447 have widths L1 and L2 from the ends of the respective through holes 411-1 to 411-3 having the diameter Ø.

The wirings 441 to 443 or 445 to 447 correspond to lands in a structure where pins inserted in through holes are soldered. The land is formed in a circular shape around the through hole to smooth a solder fillet. However, in the case of press-fit connection, solder connection is not performed, and accordingly, it can be freely formed in any shape. Accordingly, as shown in FIG. 4B, the wirings may have rectangular shapes with the widths of L1 and L2 and the depths of h1 and h2, and as shown in FIG. 5B, may be a part of a circular shape having a diameter of L1+L2+Ø.

Further, a pattern 444 (448 in FIG. 5B) is formed in a region having a width G1 between the adjacent wirings 441 and 442 (445 and 446 in FIG. 5B).

The pattern 444 (448 in FIG. 5B) is not always necessary. When an interval 451 (452 in FIG. 5B) between the wirings 442 and 443 (446 and 447 in FIG. 5B) is narrow, the wirings 442 and 443 (446 and 447 in FIG. 5B) may be arranged to be adjacent to each other without providing the pattern 444 (448 in FIG. 5B), as between the through holes 411-2 and 411-3 in FIGS. 4A and 4B (FIGS. 5A and 5B). At this time, the sizes corresponding to the widths L1 and L2 of the wirings 442 and 443 (446 and 447 in FIG. 5B) are L1' and L2'.

Regarding the sizes of the wirings 421 and 431 (423 and 433 in FIG. 5A), the wirings 422 and 432 (424 and 434 in FIG. 5A) and the wirings 441 and 442 (445 and 446 in FIG. 5A), formed on the respective circuit boards 401 to 404, the following relations are satisfied.

$L1 > L3 + G2 > 0$ $L2 > L5 + G3 > 0$ $h1, h2, h3, h4, h5 > \varnothing$ $G1, G2, G3 \geq 0$ FIGS. 4A to 4C and FIGS. 5A to 5C show a status where the press-fit terminals 100 are inserted in the above-described printed circuit board 400 or 500.

FIGS. 4A to 4C and FIGS. 5A to 5C show the press-fit terminal 100, having a forked connection member 103, which is a so-called needle-eye type terminal, however, the present invention is applicable to any terminal shape. The press-fit terminal 100 is inserted in the through holes 411-1 to 411-3 of the printed circuit board 400 or 500. The contact parts between the press-fit terminal 100 and the through holes 411-1 to 411-3 are the second layer circuit board 402 and the third layer circuit board 403. The press-fit terminal 100 is not in contact with the front surface first layer circuit board 401 and the bottom surface fourth layer circuit board 404. In this arrangement, the spring force of the press-fit terminal 100 is applied to the insulating resin and the glass fiber forming the second layer circuit board 402 and the third layer circuit board 403 inside the printed circuit board 400 in the directions indicated with arrows 41-1A and 41-1B and 41-2A and 41-2B in FIG. 3.

A force to expand acts on the insulating resin and the glass fiber forming the second layer circuit board 402 and the third layer circuit board 403 which receive the spring force of the press-fit terminal 100. The annular rings 421 and 431 (423 and 433 in FIG. 5A) formed of hard Cu and the deformation constraint wirings 422 and 432 (424 and 434 in FIG. 5C) suppress the deformation. Further, regarding the expansion at the gaps G2 and G3 between the annular rings 421 and 431 (423 and 433 in FIG. 5A) and the deformation constraint wirings 422 and 432 (424 and 434 in FIG. 5C), the deformation can be suppressed by arranging the lands 441, 442 and 443 (445, 446 and 447 in FIG. 5B) formed on the respective surfaces of the surface first layer circuit board 401 and the bottom fourth layer circuit board 404 to cover the gaps.

The above-described wiring structure, in other words, is as follows. As described using FIG. 3, in a state where the press-fit terminals 1-1 and 1-2 are inserted in the through holes 41-1 and 41-2 of the circuit board 4 (corresponding to the printed circuit board 400 or 400 in FIGS. 4A to 5C), when the circuit board 4 is viewed from an upper surface, the damage to the circuit board 4 occurs in the damage occurrence region 43 in FIG. 3, i.e., within the range of the width of the through hole diameter in a direction in which the spring force of the terminal acts.

Accordingly, when the circuit board is viewed from the upper surface, the range of the width of the through hole diameter is covered with the inner layer wirings (the annular rings and the deformation constraint wirings), as the lands 441 to 443 (445 to 447 in FIG. 5B), formed on the surface first layer circuit board 401 and the rear side fourth layer circuit board 404, and the wirings (annular rings) 421 and 431 (423 and 433 in FIG. 5C) formed on the second layer circuit board 402 and the third layer circuit board 403, held between the first layer circuit board 401 and the fourth layer circuit board 404, and the deformation constraint wirings 422 and 432 (424 and 434 in FIG. 5C). Thus it is possible to suppress expansion of the surface of the circuit board 4 (400 or 500).

Note that to effectively perform the suppression of deformation of the circuit board with the wirings, it is desirable that the thickness of the wirings is 10 μm or greater.

In this manner, regarding a part of the circuit board 4 (400 or 500) where there is a probability of deformation due to the spring force of the press-fit terminal 1, by arranging wirings having a width wider than the through hole diameter on the surface layer and the inner layer, it is possible to suppress the deformation of the printed circuit board surface layer to the minimum. Accordingly, even when the press-fit terminal 1 is employed, it is possible to prevent breakage of the wiring on the surface of the circuit board 4 (400 or 500) and ensure the reliability of the product, and it is possible to realize high density mounting by using the press-fit terminal 1.

First Embodiment

First, regarding a first embodiment, an example using the printed circuit board 400 having the structure shown in FIGS. 4A to 4C, formed with the lands, the annular rings and the deformation constraint wirings formed in a rectangular wiring will be described.

Figure 8:
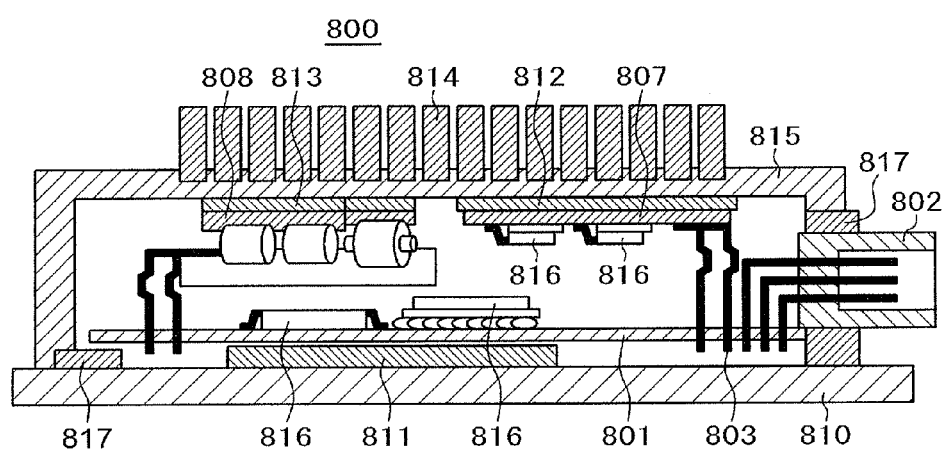
FIG. 8 is a cross-sectional diagram schematically showing the structure of an on-vehicle electronic device where the printed circuit board according to the present invention is mounted.

As shown in FIG. 8, an electronic device 800 has a structure where a connector 802 and sub modules 807 and 808 are connected to a main printed circuit board 801 (corresponding to the printed circuit board 400 in FIG. 4A), fixed to a base plate 810 via a radiation member 811, with press-fit terminals 803, and the sub modules 807 and 808 are fixed to a cover 815 to which a radiation fin 814 is attached, via radiation members 812 and 813. Electronic parts 816 are attached to the printed circuit board 801 and the sub modules 807 and 808. Further, a seal member 817 seals gaps between the base plate 810 and the connector 802 and between the base plate 810 and the cover 815.

Next, an examination is performed regarding the status of occurrence of expansion of the printed circuit board 400, corresponding to the main printed circuit board 801, used in the electronic device 800 having the above structure, upon insertion of the press-fit terminals 100 corresponding to the press-fit terminals 803, in the through holes 411-1 to 411-3 of the printed circuit board 400.

As the press-fit terminal 100, a terminal, with a Cu alloy as a mother material, having an Ni-plated base and an Sn-plated surface, is used. The press-fit terminal 100 has a needle eye shape as shown in FIG. 1. As shown in FIG. 1, the outer shape of the connection member 11 has e.g. 1.2 mm (w: stress acting direction)×0.64 mm (t: thickness direction). The printed circuit board 400 is a four-layer circuit board formed by laminating four layers of circuit boards each having a thickness of 1.6 mm, and the diameter Ø of the through hole 5 is 1.0 mm.

In FIGS. 4A to 4C, the gaps G1 to G3 are 0.3 mm; the widths L1 and L2, 0.6 mm; the widths L3 and L5, 0.2 mm; and the width L4, 0.5 mm. Further, in FIGS. 4A to 4C, the depths h1 to h5 are changed from 1.0 mm, 1.5 mm to 2.0 mm. The press-fit terminal 100 is inserted with a hand-press machine, and by adjusting an insertion distance, the press-fit terminal 100 is inserted in a position where the connection member 11 of the press-fit terminal 100 for connection with respect to the printed circuit board 400 is positioned between the second and third layers of the printed circuit board 400.

Regarding the printed circuit board 400 in which the press-fit terminal 100 is inserted, the reliability is tested by leaving the printed circuit board at a high temperature atmosphere of 150° C. for 100 hours. With this reliability test, the damage among the through holes 411-1 to 411-3 is enlarged, and the surface expansion of the printed circuit board 400 is increased. Regarding the sample after the test, by observation of a cross-section of the printed circuit board, the expansion of the printed circuit board 801 and the state of damaged of resist are inspected. A part without expansion or damage is determined as "O", but a part expanded or damaged is determined as "x".

As a comparative example, a sample where the depth h4 (see FIG. 4C) is 0.5 mm and the width of the deformation constraint wirings corresponding to the wirings 422 and 432 in FIG. 4A is narrower than the through hole diameter Ø, is formed, and similarly estimated. FIG. 7 shows the results of determination.

As a result of determination, in a sample where the depths h1 to h5 are 1.0 mm, 1.5 mm to 2.0 mm, a crack is found in the insulating resin and the glass fiber of the printed circuit board 400, however, the deformation of the deformation constraint wirings is minute, and no deformation is found in the surface layer wirings corresponding to the wirings formed on the first layer circuit board 401 and the fourth layer circuit board 404. As no change is found in the surface layer, no damage is found in the solder resist of the surface layer (441 to 443 in FIGS. 4A and 4B).

On the other hand, in a sample where the depth h4 is 0.5 mm formed as a comparative example, the deformation constraint wiring (422 in FIG. 4C) does not sufficiently function, and expansion is found in the glass fiber. The expansion of the glass fiber causes expansion of the surface layer corresponding to the surfaces of the first layer circuit board 401 and the fourth layer circuit board 404 in FIG. 4A. Further, cracks are found in the solder resist (441 to 443 in FIGS. 4A and 4B).

Accordingly, it is possible to reduce the deformation of the circuit board by providing the annular rings, the deformation constraint wirings or the lands having a width equal to or wider than the through hole diameter.

Second Embodiment

Figure 6A:
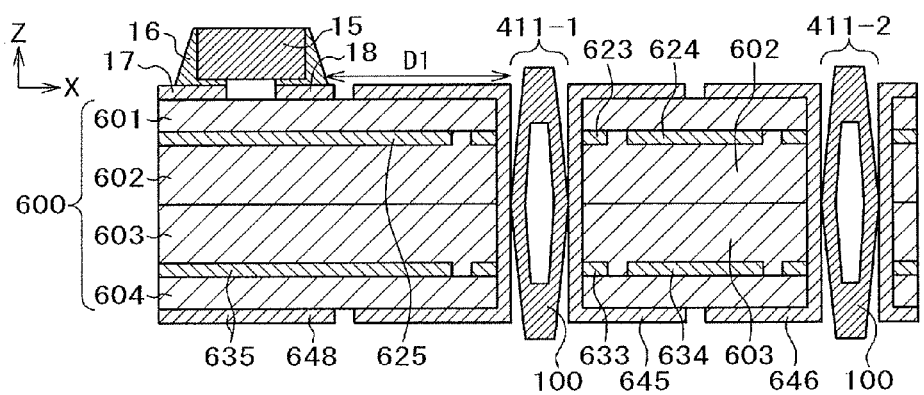
FIG. 6A is a cross-sectional diagram showing the wiring structure of the printed circuit board having the circular lands, when a part to be mounted is arranged in the vicinity of the press-fit terminal, according to the second embodiment of the present invention.
Figure 6B:
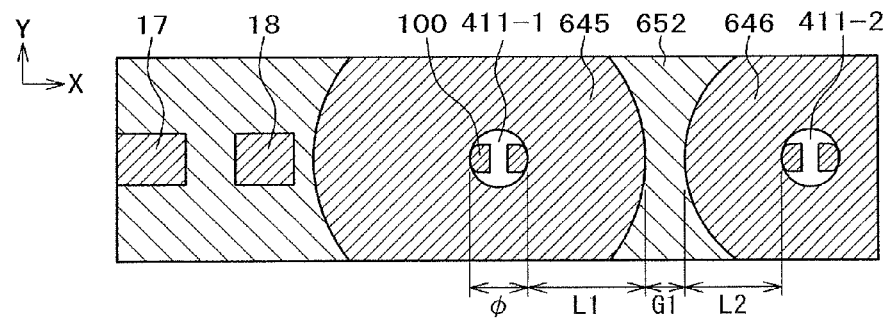
FIG. 6B is a plane diagram showing the wiring structure of the printed circuit board having the circular lands, when an electrode for arrangement of the part to be mounted is provided in the vicinity of the press-fit terminal, according to the second embodiment of the present invention.
Figures 6C, 7A, 7B:
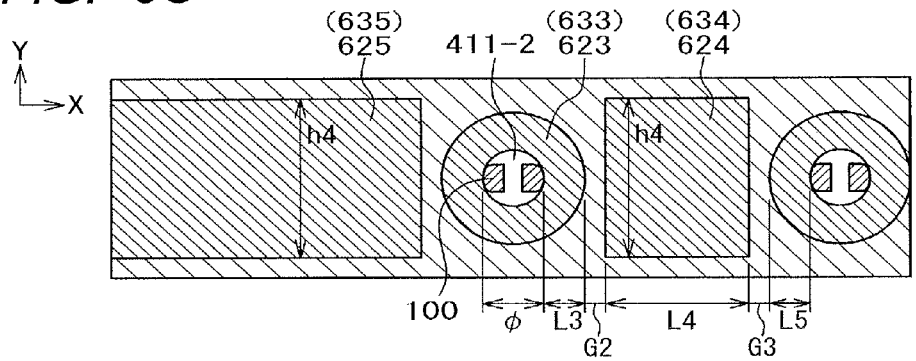
FIG. 6C is a plane diagram of the second layer circuit board showing the wiring structure of the printed circuit board having the circular lands, when the part to be mounted is arranged in the vicinity of the press-fit terminal, according to the second embodiment of the present invention.
FIG. 7A is a table showing estimation results regarding existence/absence of expansion in the printed circuit board, according to the second embodiment of the present invention.
FIG. 7B is a table showing the estimation results regarding the existence/absence of expansion in the printed circuit board, in which the part to be mounted is arranged in the vicinity of the press-fit terminal, according to the second embodiment of the present invention.

Regarding a second embodiment, an example using a printed circuit board 600 having a structure as shown in FIGS. 6A to 6C will be described. The printed circuit board 600 shown in FIGS. 6A to 6C has approximately the same structure as that of the printed circuit board 500 shown in FIGS. 5A to 5C formed with the lands 445 to 447, the annular rings and the deformation constraint wirings, formed in a circular wiring. A chip resistor device 15 is joined, with solder 16, to electrode pads 17 and 18 formed on the surface of the first layer circuit board 601 of the printed circuit board 500.

In the structure shown in FIGS. 6a to 6C, a terminal similar to that in the first embodiment is used as the press-fit terminal 100. As the printed circuit board 600, a printed circuit board formed on the same conditions as those in the first embodiment, except the laminated first layer circuit board 601 and second layer circuit board 602, third layer circuit board 603 and fourth layer circuit board 604, and lands 645 and 646 and annular rings 623 and 633, and deformation constraint wirings 624, 634, 625 and 635, is used. In FIG. 6A, numeral 648 denotes a wiring formed between the land 645 and an adjacent land (not shown).

In FIGS. 6A to 6C, the sizes of the respective parts are as follows. The diameter Ø of the through holes 411-1 and 411-2 is 1.0 mm; the gaps G1 and G3, 0.3 mm; the gap G2, 0.2 mm; the widths L1 and L2, 0.6 mm; the widths L3 and L5, 0.2 mm; and the width L4, 0.7 mm. The width h4 of the deformation constraint wirings 624 and 634 is changed from 1.0 mm, 1.5 to 2.0 mm. Further, the chip resistor device 15 is connected with the solder 16 and mounted in a position ($D_1$=0.9, 2.5 mm) away from the end of the arrayed ten through holes 411 in the stress acting direction (X direction in FIG. 6A) of the press-fit terminal 100.

In the structure shown in FIGS. 6A to 6C, inner layer wirings 625 and 635 (deformation constraint wirings) are drawn to a position directly under the chip resistor device 15. In the printed circuit board 600 having the above structure, the press-fit terminals 100 are inserted in the respective through holes 411-1 and 411-2.

Regarding the printed circuit board 600 connected with the press-fit terminals 100, the damage to the circuit board is tested by leaving the printed circuit board in an atmosphere at a high temperature of 150° C. for 100 hours. In addition, the printed circuit board is subjected to a −40/130° C.×3000 cycle temperature cycle test. In this test, the status of crack growth in the solder connection member 16 at the mounted chip resistor device 15 is examined.

As a comparative example, a sample where the width h4 of the deformation constraint wiring 624 (634) shown in FIG. 6C is 0.5 mm, and the width of the deformation constraint wiring 624 (634) is narrower than the through hole diameter Ø: 0.1 mm, is made.

FIG. 7B shows the results of determination. In the sample where the width h4 of the deformation constraint wiring 624 (634) is 1.0 mm, 1.5 to 2.0 mm, some cracks are found in the insulating resin and the glass fiber from the first layer circuit board 601 to the fourth layer circuit board 604. However, the deformation of the deformation constraint wiring 624 (634) is minute, and no deformation is found in the surface layer wiring formed on the first layer circuit board 601 and the fourth layer circuit board 604. As no change is found in the surface layer, no damage is found in solder resist on the surface layer. Further, in checking the cracks of the solder connection member 16 on the both sides of the chip resistor device 15 in the positions of $D_1$=0.9 mm and 2.5 mm after the temperature recycle inspection, the crack lengths in the solder connection member 16 are the same as those before the inspection. Accordingly, a phenomenon that the life of the mounted part closer to the through hole 411-1 is shortened does not occur.

On the other hand, regarding the sample where the width h4 of the deformation constraint wiring 624 (634) is 0.5 mm, which is narrower than the diameter Ø of the through hole 411-1, 1.0 mm, the deformation constraint wiring 624 (634) does not sufficiently function. Expansion is found in the glass fiber forming the first layer circuit board 601 to the fourth layer circuit board 604. The expansion of the glass fiber causes expansion of the surface first layer circuit board 601 and the fourth layer circuit board 604. Further, cracks are found in the solder resist. Further, regarding the cracks in the solder connection member 16 at the chip resistor device 15, the crack in the position of $D_1$=0.9 mm is longer than that in the position of $D_1$=2.5 mm.

That is, when the width h4 of the deformation constraint wiring 624 (634) is short and the deformation constraint wiring does not sufficiently function, the surfaces of the first layer circuit board 601 and the fourth layer circuit board 604 are expanded and distorted. This reduces the life of the mounted part close to the through hole 411-1. There is no problem where the mounted part is arranged away from the through hole 411-1. However, to achieve high density mounting, it is important to suppress the expansion of the surface of the circuit board.

Accordingly, by providing annular rings, deformation constraint wirings or lands having a width equal to or wider than a through hole diameter, it is possible to reduce deformation of the circuit board and increase the life of the chip part in the vicinity of the through hole.

As described above, the invention by the present inventor has been particularly explained in accordance with the embodiments; however, the present invention is not limited to the above-described embodiments. It is apparent that various changes can be made within a range not departing from the subject matter of the invention.

The invention may be embodied in other specific forms without departing from the spirit or essential characteristics thereof. The present embodiment is therefore to be considered in all respects as illustrative and not restrictive the scope of the invention being indicated by the appended claims, rather than by the foregoing description, and all changes which come within the meaning and range of equivalency of the claims are therefore intended to be embraced therein.

The invention claimed is:

1. A printed circuit board in which three or more layers of circuit boards are laminated and a large number of through holes for insertion of terminal pins of electronic parts are formed,
   wherein lands of a conductor material are formed around a first through hole and a second through hole of the large number of through holes on surfaces of a top layer circuit board and a bottom circuit board, and the first land around the first through hole and the second land around the second through hole formed on the side of the top layer circuit board are electrically connected to the land around the first through hole and the land around the second through hole formed on the side of the bottom layer circuit board via a conductor member formed on an inner wall surface of the first through hole or a conductor member formed on an inner wall surface of the second through hole,
   wherein, in a circuit board held between the top layer circuit board and the bottom layer circuit board, a first conductor film connected to the conductor member formed on the inner wall surface of the first through hole and a second conductor film connected to the conductor member formed on the inner wall surface of the second through hole, and a third conductor film, held between the first conductor film and the second conductor film, not electrically connected to the first conductor film and the second conductor film, are formed, and
   wherein, when the printed circuit board is viewed from an upper surface, in a region from the first through hole to the second through hole, any one of the first land and the second land, the first conductor film and the second conductor film, and the third conductor film, exists in a width equal to or wider than a diameter of the first through hole and the second through hole.

2. The printed circuit board according to claim 1, wherein the printed circuit board is formed by laminating four or more layers of circuit boards, and when the printed circuit board is viewed from the upper surface, in the region from the first through hole to the second through hole, any one of the first land and the second land, the first conductor film and the second conductor film, and the third conductor film, exists in a plurality of layers, in a width equal to or wider than a diameter of the first through hole and the second through hole.

3. The printed circuit board according to claim 1, wherein the conductor film, not electrically connected to the conductor member formed on the inner wall surface of the through hole formed in the circuit board held between the top layer circuit board and the bottom layer circuit board, is formed in a rectangular region of the held circuit board.

4. The printed circuit board according to claim 1, wherein the conductor film electrically connected to the conductor member formed on the inner wall surface of the through hole and the conductor film not electrically connected to the conductor member formed on the inner wall surface of the through hole, formed in the circuit board held between the top layer circuit board and the bottom layer circuit board, have a thickness equal to or greater than 10 μm.

5. A printed circuit board in which three or more layers of circuit boards are laminated and a large number of through holes for insertion of press-fit terminals of an electronic part are formed,
- wherein lands of a conductor material are formed around the through holes on a front surface and a rear surface of the printed circuit board, and the lands on the side of the front surface and the lands on the side of the rear surface are electrically connected via conductor films formed on inner wall surfaces of the through holes,
- wherein a plurality of conductor films, including a conductor film connected to the conductor film formed on the inner wall surface of the through hole and a conductor film not electrically connected to the conductor film formed on the inner wall surface of the through hole, are formed on a circuit board held between a top layer circuit board and a bottom layer circuit board among the three or more layers of laminated circuit boards, and
- wherein when the printed circuit board is viewed from an upper surface, between adjacent through holes on which a compressive force acts upon insertion of the press-fit terminal, among the large number of through holes, the land or the conductor film connected to the conductor film formed on the inner wall surface of the through hole or the conductor film not electrically connected to the conductor film formed on the inner wall surface of the through hole, formed in the circuit board held between the top layer circuit board and the bottom layer circuit board, exists in a width equal to or wider than the diameter of the through hole.

6. The printed circuit board according to claim 5,
- wherein the printed circuit board is formed by laminating four or more layers of circuit boards, and when the printed circuit board is viewed from the upper surface, between adjacent through holes on which a compressive force acts upon insertion of the press-fit terminal, among the large number of through holes, the land or the conductor film connected to the conductor film formed on the inner wall surface of the through hole or the conductor film not electrically connected to the conductor film formed on the inner wall surface of the through hole, formed in the circuit board held between the top layer circuit board and the bottom layer circuit board, exists in a width equal to or wider than the diameter of the through hole.

7. The printed circuit board according to claim 5,
- wherein the conductor film not electrically connected to the conductor film formed on the inner wall surface of the through hole formed in the circuit board held between the top layer circuit board and the bottom layer circuit board is formed in a rectangular region of the held circuit board.

8. The printed circuit board according to claim 5,
- wherein the conductor film electrically connected to the conductor film formed on the inner wall surface of the through hole and the conductor film not electrically connected to the conductor film formed on the inner wall surface of the through hole, formed in the circuit board held between the top layer circuit board and the bottom layer circuit board, have a thickness equal to or greater than 10 μm.

* * * * *